United States Patent
Ito et al.

(10) Patent No.: US 12,131,882 B2
(45) Date of Patent: Oct. 29, 2024

(54) CHARGED PARTICLE BEAM DEVICE

(71) Applicant: Hitachi High-Tech Corporation, Tokyo (JP)

(72) Inventors: Shuntaro Ito, Tokyo (JP); Hiromi Mise, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 407 days.

(21) Appl. No.: 17/595,807

(22) PCT Filed: May 29, 2019

(86) PCT No.: PCT/JP2019/021175
§ 371 (c)(1),
(2) Date: Nov. 24, 2021

(87) PCT Pub. No.: WO2020/240719
PCT Pub. Date: Dec. 3, 2020

(65) Prior Publication Data
US 2022/0230840 A1 Jul. 21, 2022

(51) Int. Cl.
*H01J 37/24* (2006.01)

(52) U.S. Cl.
CPC ....... *H01J 37/24* (2013.01); *H01J 2237/2485* (2013.01)

(58) Field of Classification Search
CPC .......................... H01J 37/24; H01J 2237/2485
See application file for complete search history.

(56) References Cited

U.S. PATENT DOCUMENTS 5,522,067 A 5/1996 Swire
2017/0125209 A1* 5/2017 De Boeij .............. H01J 37/268

FOREIGN PATENT DOCUMENTS

| JP | 2001-94937 A | 4/2001 |
|----|---|---|
| JP | 2001-256111 A | 9/2001 |
| JP | 2003-36807 A | 2/2003 |
| JP | 2004-171936 A | 6/2004 |
| JP | 2008-218857 A | 9/2008 |

(Continued)

OTHER PUBLICATIONS

International Search Report (PCT/ISA/210) issued in PCT Application No. PCT/JP2019/021175 dated Aug. 6, 2019 with English translation (three (3) pages).

(Continued)

*Primary Examiner* — Nicole M Ippolito
*Assistant Examiner* — Hanway Chang
(74) *Attorney, Agent, or Firm* — Crowell & Moring LLP

(57) ABSTRACT

A charged particle beam device includes a charged particle beam device main body, a computer configured to control the charged particle beam device main body, including a CPU and a DRAM, and including software for controlling the charged particle beam device main body, a monitoring unit configured to monitor a resource usage status in the computer, an allocation availability determination unit configured to determine whether or not a resource for executing processing required by the software is allocatable in the computer according to a monitoring result of the monitoring unit, and a notification unit configured to notify, when the determination of the allocation availability determination unit is negative, information indicating that the determination is negative.

6 Claims, 6 Drawing Sheets

(56) References Cited

FOREIGN PATENT DOCUMENTS

| | | |
|---|---|---|
| JP | 2012-216092 A | 11/2012 |
| JP | 2018-98576 A | 6/2018 |

OTHER PUBLICATIONS

Japanese-language Written Opinion (PCT/ISA/237) issued in PCT Application No. PCT/JP2019/021175 dated Aug. 6, 2019 (three (3) pages).
Korean-language Office Action issued in Korean Application No. 10-2021-7036552 dated Jun. 21, 2023 (4 pages).

* cited by examiner

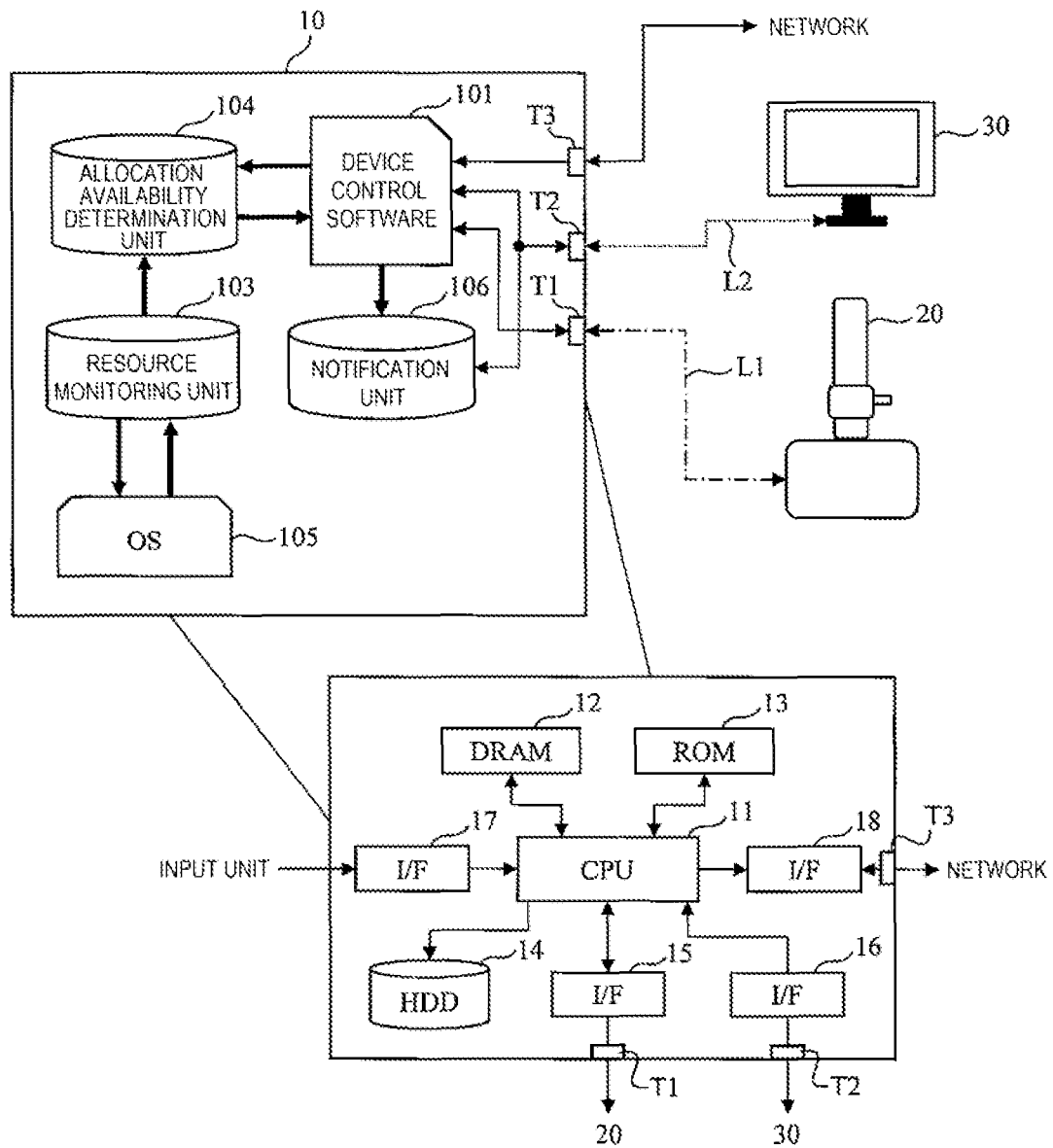

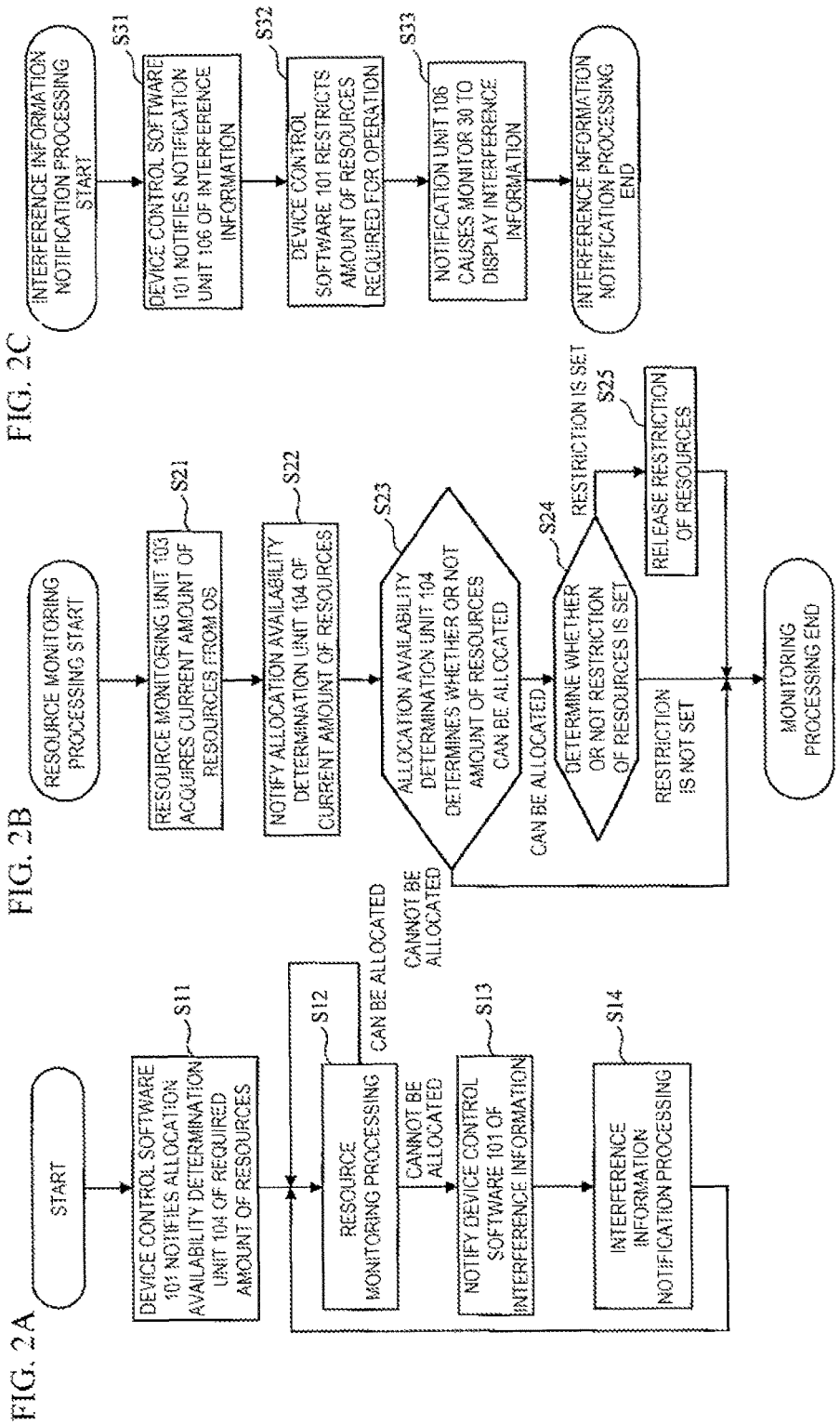

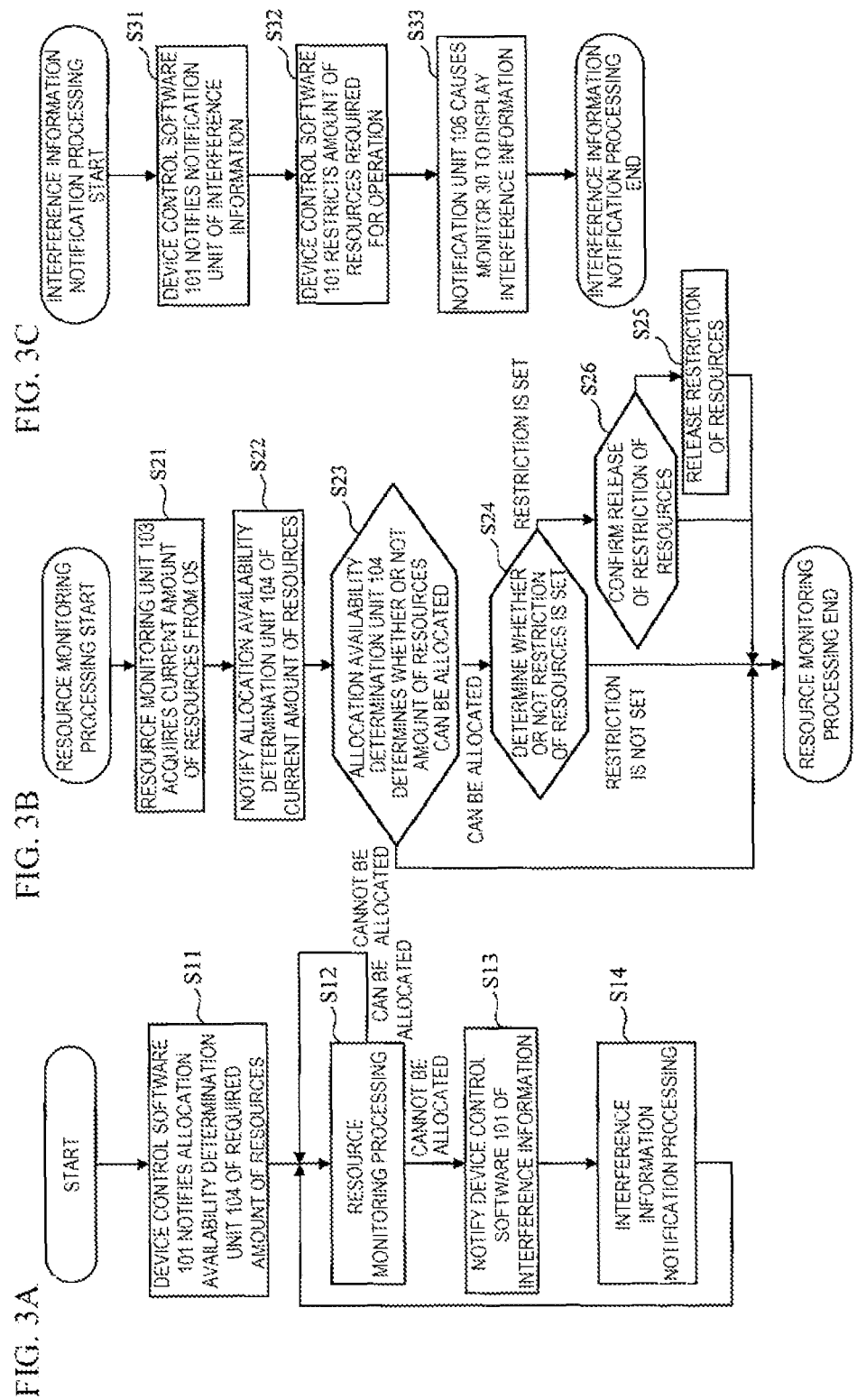

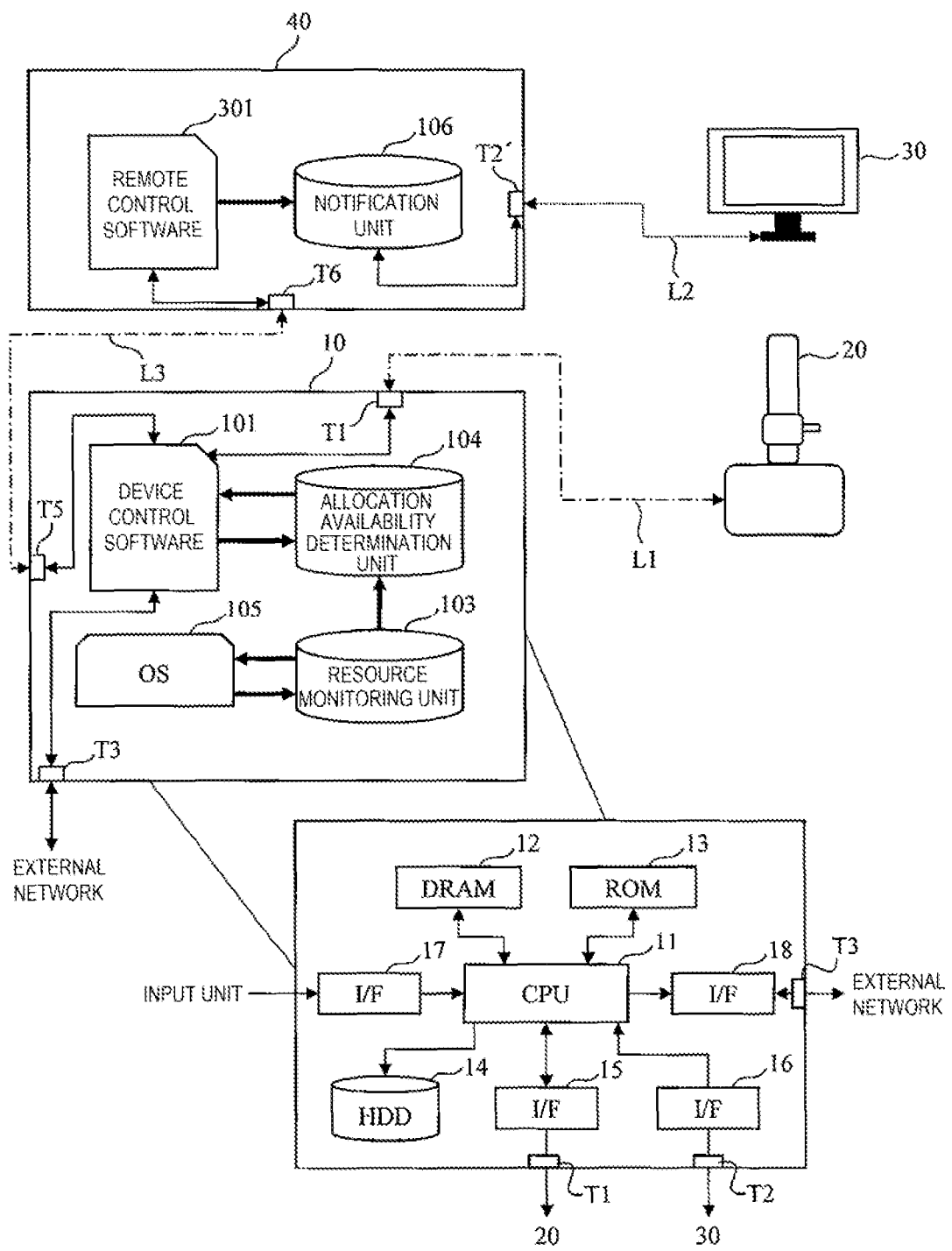
[FIG. 4]

[FIG. 5]
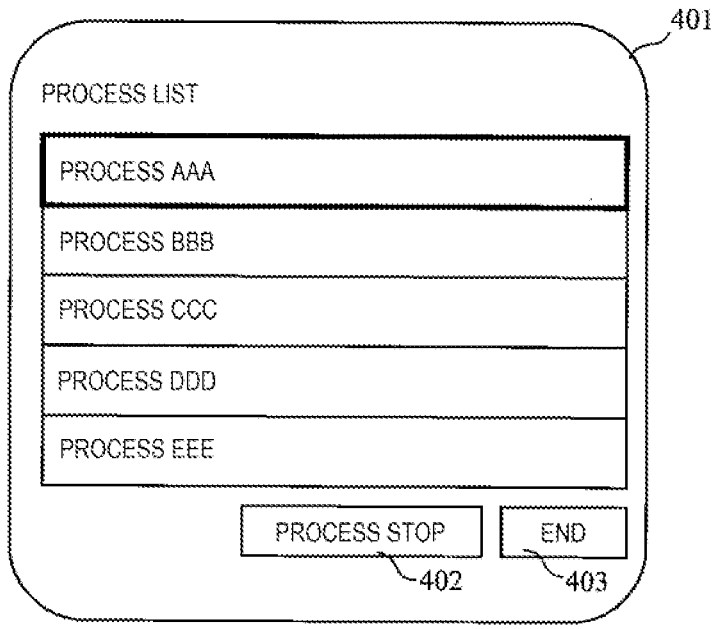
[FIG. 6]
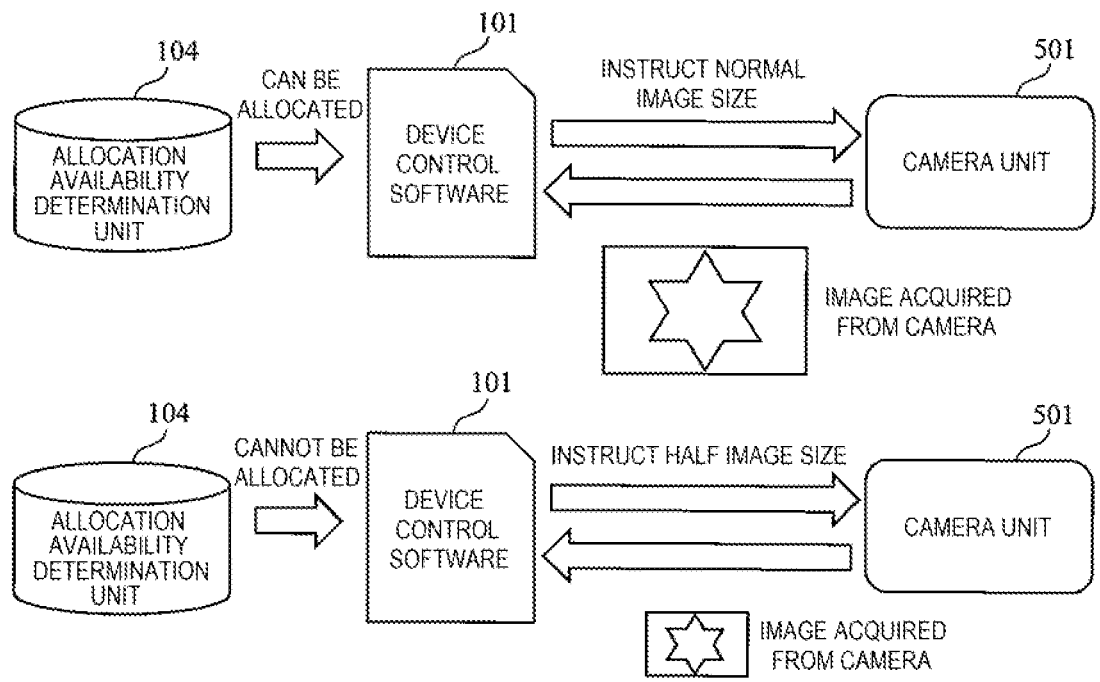

[FIG. 7]
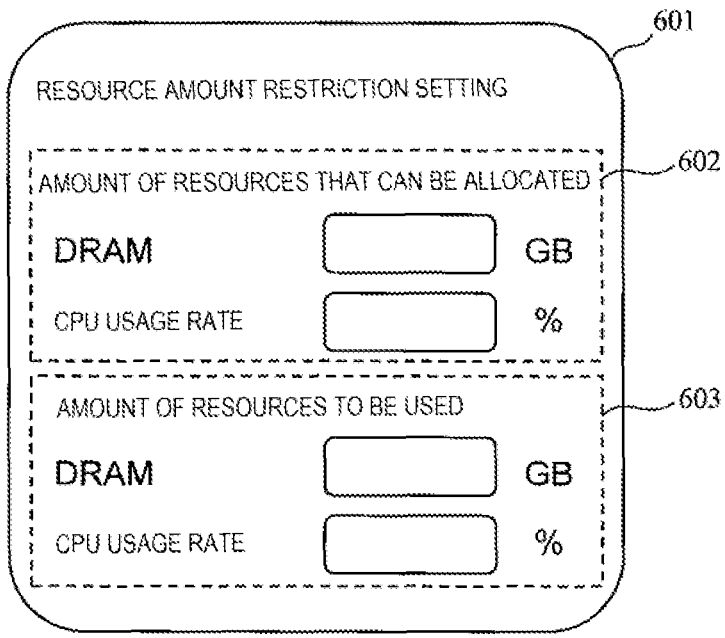
[FIG. 8]
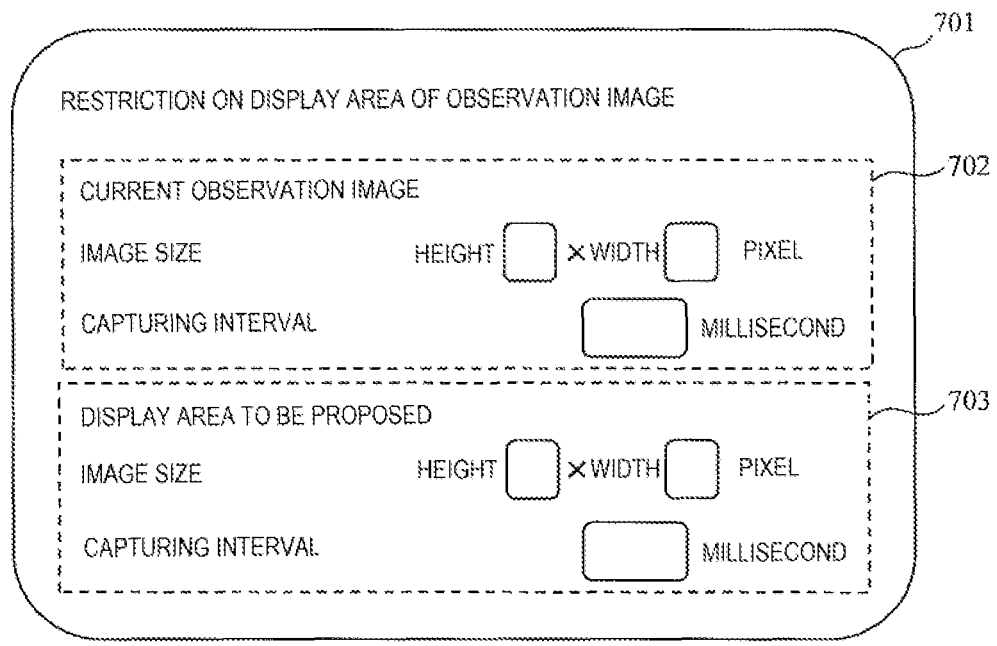

CHARGED PARTICLE BEAM DEVICE

TECHNICAL FIELD

The present invention relates to a charged particle beam device.

BACKGROUND ART

In the related art, a computer which is connected to an electron microscope serving as a charged particle beam device and which is used for controlling the electron microscope is usually used in a stand-alone form or used in a state of being connected to an intranet and not connected to an external network. However, in recent years, the need for connecting the computer connected to an electron microscope to an external computer via a network to transmit and receive data and the like is increasing.

For example, PTL 1 discloses a technique in which remote monitoring (for example, remote monitoring of an electron generation chip of an electron gun) of an electron microscope disposed on a client (customer) side is executed in a service server connected to the electron microscope via a network, the service to the client is improved, and the operation rate of the electron microscope is improved.

In addition, a system has begun to be used in which a computer connected to an electron microscope is connected to a network outside an intranet, so that various services can be enjoyed. In such a system, in the computer connected to an electron microscope, installation and update of security software and periodic update of an operating system (OS) are required. Therefore, in the computer, since opportunities for software other than control software for the electron microscope to operate increase, resource insufficiency in the computer may be concerned.

In the computer, it is difficult to grasp or predict, in advance, an amount of resources (a CPU, a DRAM, and the like) available in a computer by the software other than the control software for the electron microscope. Therefore, as a result of the operation of the software other than the control software, resources required for the operation of the control software cannot be allocated, and the operation of the control software may be unstable. In a system of the charged particle beam device such as the electron microscope, since a high-voltage power source or an electron beam is handled, the unstable control software needs to be avoided.

CITATION LIST

Patent Literature

PTL 1: JP-A-2003-36807

SUMMARY OF INVENTION

Technical Problem

The invention has been made in view of the above problems, and an object of the invention is to provide a charged particle beam device capable of reliably allocating resources of control software and realizing stable operation of the control software even when a computer for controlling the charged particle beam device is connected to an external computer.

Solution to Problem

In order to solve the above problems, a charged particle beam device according to the invention includes a charged particle beam device main body, a computer configured to control the charged particle beam device main body, including a CPU and a DRAM, and including software for controlling the charged particle beam device main body, a monitoring unit configured to monitor a resource usage status in the computer, an allocation availability determination unit configured to determine whether or not a resource for executing processing required by the software is allocatable in the computer according to a monitoring result of the monitoring unit, and a notification unit configured to notify, when the determination of the allocation availability determination unit is negative, information indicating that the determination is negative.

Advantageous Effect

According to the invention, a charged particle beam device capable of reliably allocating resources of control software and realizing stable operation of the control software even when a computer for controlling the charged particle beam device is connected to an external computer can be provided.

BRIEF DESCRIPTION OF DRAWINGS

FIG. 1 is an overall configuration diagram illustrating an example of a configuration of a charged particle beam device according to a first embodiment.

FIG. 2 shows FIGS. 2A-2C show flowcharts illustrating examples of operations of the charged particle beam device according to the first embodiment.

FIG. 3 shows FIGS. 3A-3C show flowcharts illustrating other examples of the operations of the charged particle beam device according to the first embodiment.

FIG. 4 is an overall configuration diagram illustrating an example of a configuration of a charged particle beam device according to a second embodiment. FIG. 5 is a schematic diagram illustrating a charged particle beam device according to a third embodiment.

FIG. 6 is a schematic diagram illustrating a charged particle beam device according to a fourth embodiment.

FIG. 7 is a schematic diagram illustrating a charged particle beam device according to a fifth embodiment.

FIG. 8 is a schematic diagram illustrating a charged particle beam device according to a sixth embodiment.

DESCRIPTION OF EMBODIMENTS

Hereinafter, embodiments will be described with reference to accompanying drawings. In the accompanying drawings, functionally same elements may be donated by the same numbers. Although the accompanying drawings show embodiments and implementation examples in accordance with principles of the present disclosure, the drawings are shown for the understanding of the present disclosure and are not intended to limit the invention. Descriptions in this specification are merely exemplary, and are not intended to limit the scope of the claims or application of the present disclosure in any sense.

It is necessary to understand that the embodiments are described in sufficient detail for those skilled in the art to perform the present disclosure, but other implementations and aspects are possible, and the configuration and the structure can be changed and various elements can be replaced without departing from the scope and the spirit of the technical idea of the present disclosure. Therefore, the following description should not be construed as being limited to the embodiments.

First Embodiment

First, an example of a configuration of a charged particle beam device according to a first embodiment will be described with reference to FIG. 1. As shown in FIG. 1, the charged particle beam device includes a computer (a control terminal) 10, a charged particle beam device main body 20, and a monitor 30. In FIG. 1, a hardware configuration and a software configuration of the computer 10 are illustrated together.

The computer 10 and the charged particle beam device main body 20 are connected by, for example, a cable L1 for a local area network (hereinafter referred to as a LAN), and are configured to transmit and receive data and control signals to and from each other. In addition, the computer 10 and the monitor 30 are also connected by a monitor cable L2. Although not shown, the charged particle beam device main body 20 can include an electron gun unit that emits a charged particle beam from a charged particle source, a lens body unit that converges or deflects the charged particle beam, a sample support unit that holds a sample in a lens body, a detector unit that detects electrons when the sample is scanned, and a camera unit that detects electrons transmitted through the sample. The charged particle beam emitted from the electron gun unit is converged or deflected by the lens body unit, and is emitted onto the sample on the sample support unit. Information of the sample is visualized by using the detector unit or the camera unit depending on a purpose. As a visualization method, for example, a method for capturing as image data is used. Visualization information of the sample acquired from the charged particle beam device main body 20 and a graphical user interface (hereinafter, GUI) of device control software 101 are displayed on the monitor 30 connected to the computer 10.

The computer 10 is a control terminal for controlling the charged particle beam device main body 20. Specifically, the computer 10 includes, as the hardware configuration, a CPU 11, a DRAM 12, a ROM 13, a hard disk drive (HDD) 14, and interfaces (I/Fs) 15 to 18.

The CPU 11 is an arithmetic processing unit that performs arithmetic control required for operations of the charged particle beam device main body 20, and the operations include generation of control signals for controlling the charged particle beam device main body 20, reception of signals and data from the charged particle beam device main body 20, data processing and management, and the like. The DRAM 12 is a volatile memory device for temporarily storing various data generated in operations of the computer 10. In addition, the ROM 13 is a non-volatile memory device that stores initial setting data and various programs.

The HDD 14 is a storage device that stores software (a computer program) including the device control software 101 and an operating system (OS) 105. In addition, the HDD 14 can also be used as a storage device that stores image data of an image imaged by the charged particle beam device main body 20 and analysis data that is an analysis result of the image. The I/Fs 15 to 17 manage input and output of data between the charged particle beam device main body 20 and the CPU 11, between the monitor 30 and the CPU 11, and between an input unit (not shown) and the CPU 11, via terminals T1 and T2. In addition, the I/F 18 is connected to an external computer (not shown) or a server via a terminal T3 and a network. It is needless to say that the computer 10 may additionally include a processor circuit or a storage device (not shown).

The computer 10 includes the device control software 101 and the OS 105. The device control software 101 is software for controlling the charged particle beam device main body 20. The OS 105 is basic software that controls the overall operation of the computer 10. In addition, the computer 10 includes a resource monitoring unit 103, an allocation availability determination unit 104, and a notification unit 106. The resource monitoring unit 103, the allocation availability determination unit 104, and the notification unit 106 may be realized by the OS 105 and software (not illustrated in FIG. 1).

The resource monitoring unit 103 has a function of monitoring a usage rate of the CPU 11, a usage amount of the DRAM 12, and other computer resource usage status in cooperation with the OS 105. The resource monitoring unit 103 may monitor both the usage rate of the CPU 11 and the usage amount of the DRAM 12 as a resource usage status, or may monitor only one of the usage rate of the CPU 11 and the usage amount of the DRAM 12. In addition, operating statuses of processor circuits, storage devices, and the like other than the CPU 11 and DRAM 12 can also be monitored.

In addition, the allocation availability determination unit 104 determines whether or not resources for executing processing required by the device control software 101 can be allocated in the computer 10 (including the CPU 11, the DRAM 12, and the like) according to an output (a monitoring result) of the resource monitoring unit 103. The notification unit 106 receives a determination result of the allocation availability determination unit 104 via the device control software 101, and notifies a user by, for example, displaying the result on a screen of the monitor 30. The notification method in the notification unit 106 is not limited to the display on the monitor 30, and a means capable of notifying the user, such as a printer or voice, can be used. The plurality of notification methods may be used in combination.

Here, when the computer 10 is connected to only the charged particle beam device main body 20 and is not connected to an external computer (when the computer 10 is a stand-alone computer), substantially only the device control software 101 consumes the resources (the usage rate of the CPU 11 and the usage amount of the DRAM 12) in the computer 10. Therefore, it is easy to predict the resource usage status in the computer 10. However, the computer 10 of this embodiment is connected to an external computer via a network, and is capable of transmitting and receiving the image data imaged by the charged particle beam device main body 20 and other analysis data to and from an external computer, for example.

When data and the like is transmitted to and received from an external computer, the usage rate of the CPU 11 and the usage amount of the DRAM 12 by the OS 105 and communication software (not shown) increase. In addition, the OS 105 may be updated periodically or irregularly, and such an operation also unexpectedly increases the usage rate of the CPU 11 and the usage amount of the DRAM 12.

Therefore, in the computer 10, the resource monitoring unit 103 monitors the resource usage status including the usage rate of the CPU 11, the usage amount of the DRAM 12, and the like, and the allocation availability determination unit determines whether or not the resources required by the device control software 101 can be allocated according to the monitoring result. Accordingly, even when the computer 10 is connected to an external computer via a network and resources are consumed unexpectedly, an appropriate operation in the device control software 101 can be ensured.

Next, examples of operations related to resource monitoring and the like in the charged particle beam device according to the first embodiment will be described with reference to flowcharts of FIG. 2.

In step S11, the device control software 101 notifies the allocation availability determination unit 104 of a required amount of resources including a usage rate of the CPU and a usage amount of the DRAM and the like required for an own operation of the device control software 101.

In the subsequent step S12, the resource monitoring unit 103 starts processing of monitoring the resource usage status (including the usage rate of the CPU 11 and the usage amount of the DRAM 12) in the computer 10. The resource monitoring processing will be described in detail later.

Based on a monitoring result, whether or not resources for executing the processing required in the device control software 101 can be allocated in the computer 10 is determined. When it is determined that the resources can be allocated, step S12 is continued, and when it is determined that the resources cannot be allocated, the process proceeds to step S13.

In step S13, when it is determined that the resources cannot be allocated, the allocation availability determination unit 104 generates interference information and notifies the device control software 101 of the interference information. The interference information may include at least whether or not the amount of resources required for operation can be allocated, a name (or ID) of a process executed by the device control software 101, a usage rate of the CPU 11 of each process, a usage amount of the DRAM 12 of each process, and the like. The device control software 101 executes interference information notification processing according to the received interference information (step S14). The interference information notification processing will be described in detail later.

The resource monitoring processing will be described in detail with reference to steps S21 to S25 shown in the center of FIG. 2. First, in step S21, the resource monitoring unit 103 sends, to the OS 105, a query that inquires resource usage status of each process executed by the computer 10.

In step S22, when receiving the query, the OS 105 confirms the resource usage status of each process and notifies (replies) the resource usage status of each process to the resource monitoring unit 103. The resource monitoring unit 103 determines the resource usage status according to the received information, and transmits the resource usage status to the allocation availability determination unit 104.

In step S23, the allocation availability determination unit 104 determines whether or not the amount of resources required for the operation of the device control software 101 can be allocated in the computer 10 according to the received data of the resource usage status. The allocation availability determination unit 104 calculates a remaining amount of resources based on the current resource usage status notified from the resource monitoring unit 103, and compares the remaining amount of resources with the amount of resources required for the operation of the device control software 101. According to a result of the comparison, whether or not the amount of resources can be allocated is determined.

When it is determined that the resources can be allocated, the process proceeds to step S24. When it is determined that the resources cannot be allocated, the resource monitoring processing (S12) ends, and the process proceeds to step S13 described above.

In step S24, whether or not a restriction of the amount of resources to be used by the device control software 101 is set is determined. When the restriction is set, the device control software 101 releases the restriction in step S25, then ends the resource monitoring processing, and the process proceeds to step S13. On the other hand, when it is determined that the amount of resources is not restricted, the resource monitoring processing ends, and the process proceeds to step S13.

Next, the interference information notification processing of step S14 will be described in detail with reference to steps S31 to S33 shown on a right side of FIG. 2. In step S31, the device control software 101 notified of the interference information notifies the notification unit 106 of the interference information. In step S32, the device control software 101 restricts the amount of resources in the computer 10 to be used by the device control software 101 according to the interference information. For example, the amount of resources can be restricted by at least reducing a capacity of image data to be used for real-time display of an observation image by the charged particle beam device body 20 and reducing a procedure of image processing to be applied to the image data. An input of such a restriction can be performed by the user from an input unit (a keyboard, a mouse, or the like) of the computer 10 while confirming the display of the monitor 30. In this case, the input unit functions as a restriction unit that restricts the usage amount of resources in the computer 10 to be used by the device control software 101 when the determination of the allocation availability determination unit 104 is negative.

Subsequently, in step S33, the notification unit 106 causes the monitor 108 to display the interference information. As a result, the user can grasp the amount of resources available for the device control software 101 and refer to the amount of resources at the time of the operation.

FIG. 3 shows flowcharts of other examples of the operations related to resource monitoring and the like in the charged particle beam device according to the first embodiment. In step S24, the presence or absence of the resource restriction is confirmed, and when there is a restriction, the restriction is released (step S25), which is the same as FIG. 2. However, before the release, in step S26, the user confirms whether or not to release the resource restriction, and the resource restriction is released when the user selects to release the resource restriction. This point is a difference from FIG. 2. In step S26, it is possible to perform at least one of confirmation of a message and confirmation of a setting value related to the release.

As described above, according to the charged particle beam device of the first embodiment, the resources of the computer are monitored by the resource monitoring unit 103, whether or not the resources can be allocated is determined by the allocation availability determination unit 104, and when it is determined that the resources cannot be allocated, a notification of the result is issued. Therefore, even when the computer is connected to an external computer, the resources of the device control software can be reliably allocated, and the stable operation of the device control software can be realized.

Second Embodiment

Next, an example of a configuration of a charged particle beam device according to a second embodiment will be described with reference to FIG. 4. In FIG. 4, the same components as those of the configuration of the first embodiment (FIG. 1) are denoted by the same reference numerals, and a repetitive description thereof will be omitted below. The device according to the second embodiment includes the computer 10 and a remote control terminal 40.

The remote control terminal 40 includes remote control software 301 and the notification unit 106, and is connected to the computer 10 via terminals T5 and T6 through the LAN (a cable L3). By the operation of the remote control software 301, the computer 10 can be remotely controlled by the remote control terminal 40. The function of the notification unit 106 is the same as that of the notification unit 106 of the first embodiment. Other configurations of the computer 10 are the same as the configuration of the computer 10 of the first embodiment. The remote control terminal 40 is connected to the monitor 30 through the LAN (the cable L2) via a terminal T2'. The notification unit 106 transmits the interference information received from the allocation availability determination unit 104 via the remote control software 301 to the monitor 30 and causes the monitor 30 to display the interference information.

In FIG. 4, since the remote control terminal 40 is connected to the monitor 30, the computer 10 is not connected to the monitor 30, but the computer 10 may be further connected to another monitor (not shown) different from the monitor 30.

An operation of the device of the second embodiment is substantially the same as the operation of the first embodiment (FIGS. 2 and 3). A difference is that when the interference information is notified from the allocation availability determination unit 104, the interference information is notified to the notification unit 106 through the LAN (the cable L3) via the remote control software 301 of the remote control terminal 40.

In addition, in FIG. 4, the device control software 101 is controlled by the remote control software 301 existing in the remote control terminal 40, but the remote control terminal 40 may acquire only GUI information of the computer 10 and display the GUI information on the monitor 30, and the user may control the device control software 101 existing in the computer 10 based on the GUI information displayed on the monitor 30. In this case, the notification unit 106 needs to exist in the computer 10. According to the second embodiment, the same effect as that of the first embodiment can be exerted. In addition, the charged particle beam device main body 20 can be controlled from the remote control terminal 40 separated from the computer 10.

Third Embodiment

A charged particle beam device according to a third embodiment will be described with reference to FIG. 5. An entire configuration of the charged particle beam device of the third embodiment can be the same as those of the embodiments described above, and thus a repetitive description thereof will be omitted. In the third embodiment, the operation when it is determined in the allocation availability determination unit 104 that the resources cannot be allocated, specifically, the operation for executing the resource restriction is different from those in the embodiments described above. This point will be described below with reference to FIG. 5.

When the allocation availability determination unit determines that the resources cannot be allocated, the notification unit 106 causes the monitor 30 to display a process list 401 shown in FIG. 5. This process list 401 is a list of names of processes (AAA to EEE) that are normally executed in the device control software 101, and a process stop button 402 and an end button 403 are displayed below the process list 401. Although not illustrated in FIG. 5, in order to clearly indicate that the resources are insufficient for the user, a message or the like indicating that the resources are insufficient may be displayed together on the monitor 30.

The user views the process list displayed on the monitor 30, designates a process that is to be stopped or may be stopped among the plurality of processes AAA to EEE via an input unit such as a mouse or a keyboard, and then presses the process stop button 402. As a result, a part of the processes executed in the device control software 101 is stopped, thereby reducing the required resources, and the operation of the device control software 101 can be performed even under the resource insufficient condition. When the instruction to stop the process is completed, the end button 403 can be pressed to close the process list 401.

As described above, according to the charged particle beam device of the third embodiment, the same effect as that of the first embodiment can be exerted. In addition, when the resources are insufficient, a certain process can be stopped by the selection of the user, so that the operation of the device control software adapted to the request of the user can be ensured.

Fourth Embodiment

A charged particle beam device according to a fourth embodiment will be described with reference to FIG. 6. An entire configuration of the charged particle beam device of the fourth embodiment can be the same as those of the embodiments described above, and thus a repetitive description thereof will be omitted. In the fourth embodiment, the operation when it is determined in the allocation availability determination unit 104 that the resources cannot be allocated, specifically, the operation for executing the resource restriction is different from those in the embodiments described above.

As shown in FIG. 6, in the fourth embodiment, when the allocation availability determination unit 104 determines that the resources can be allocated, the device control software 101 instructs a camera unit 501 of the charged particle beam device main body 20 to transmit an image size required for real-time image acquisition. The camera unit 501 transmits an image having the instructed image size to the device control software 101.

On the other hand, when the allocation availability determination unit 104 determines that the resources cannot be allocated, the device control software 101 instructs the camera unit 501 to transmit an image having a size half of the image size required for the real-time image acquisition. The camera unit 501 transmits an image having the instructed image size to the device control software 101.

As described above, the charged particle beam device of the fourth embodiment is configured to change the size of the image acquired from the camera unit 501 according to the determination result of whether or not the resources can be allocated. This makes it possible to continue the real-time image acquisition even when the amount of resources is restricted.

Fifth Embodiment

A charged particle beam device according to a fifth embodiment will be described with reference to FIG. 7. An entire configuration of the charged particle beam device of the fifth embodiment can be the same as those of the embodiments described above, and thus a repetitive description thereof will be omitted. In the fifth embodiment, the operation when it is determined in the allocation availability determination unit 104 that the resources cannot be allocated, specifically, the operation for executing the resource restriction is different from those in the embodiments described above.

When the allocation availability determination unit 140 determines that the resources cannot be allocated, the notification unit 106 causes the monitor 30 to display a resource amount restriction setting screen 601 shown in FIG. 7. This resource amount restriction setting screen 601 is a screen for notifying the user of a resource insufficient status and restricting, by selection of the user, the amount of resources to be used. This screen 601 includes a display unit 602 that displays an amount of resources that can be allocated for the device control software 101, and an input unit 603 that allows the user to designate an amount of resources to be used by the device control software 101.

As an example, the display unit 602 displays the amount of resources that can be allocated for the computer 10 with the amount of resources being separated into an available capacity in the DRAM 12 and a usage rate of the CPU 11, which are examples of the amount of resources that can be allocated, and either one of the available capacity of the DRAM 12 and the usage rate of the CPU 11 may be used, or other indices may be used in addition to the available capacity in the DRAM 12 and the usage rate of the CPU 11.

In addition, the user can input the capacity to be used in the DRAM 12 and the usage rate of the CPU 11 via the input unit 603. The user can confirm display contents of the display unit 602, and can input, for example, for the capacity used in the DRAM 12 and the usage rate of the CPU 11, numerical values smaller than numerical values displayed on the display unit 602. As a result, the amount of resources used by the device control software 101 can be freely restricted in a status where the resources are insufficient.

Sixth Embodiment

A charged particle beam device according to a sixth embodiment will be described with reference to FIG. 8. An entire configuration of the charged particle beam device of the sixth embodiment can be the same as those of the embodiments described above, and thus a repetitive description thereof will be omitted. In the sixth embodiment, the operation when it is determined in the allocation availability determination unit 104 that the resources cannot be allocated, specifically, the operation for executing the resource restriction is different from those in the embodiments described above.

When the allocation availability determination unit 140 determines that the resources cannot be allocated, the notification unit 106 causes the monitor 30 to display a display area setting screen 701 shown in FIG. 8. This display area setting screen 701 is a screen for notifying the user of a resource insufficient status, restricting a display area of an imaged observation image by the selection of the user, and reducing the amount of resources required by the device control software 101.

Specifically, this resource restriction setting screen 701 includes a first display section 702 and a second display section 703. The first display section 702 is a section on which an image size (a display area) of a currently set observation image and a capturing interval are displayed. In addition, the second display section 703 is a section on which an image size of an observation image that enables the device control software 101 to operate, which is determined according to the amount of resources available by the device control software 101 and a capturing interval are displayed.

The user can confirm the display area of the observation image and the capturing interval which are displayed and proposed on the second display section 703 of the monitor 30 and can also set values equal to or less than proposed values as necessary. The device control software 101 restricts the value displayed on the second display section 703 according to the value set in the first display section 702 and the amount of available resources. FIG. 8 is an example, and only one of the image size and the capturing interval may be displayed, or other elements may be displayable and selectable.

The invention is not limited to the embodiments described above, and includes various modifications. For example, the embodiments described above have been described in detail for easily understanding the invention, and the invention is not necessarily limited to those including all the configurations described above. In addition, a part of the configuration of one embodiment can be replaced with the configuration of another embodiment, and the configuration of one embodiment can be added to the configuration of another embodiment. In addition, a part of the configuration of each embodiment can be added to, deleted from, or replaced with other configurations. A part or all of the configurations, functions, processing units, processing sections, and the like described above may be implemented by hardware, for example, by designing an integrated circuit.

REFERENCE SIGN LIST

10 . . . computer (control terminal), 11 . . . CPU, 12 . . . DRAM, 13 . . . ROM, 14 . . . hard disk drive (HDD), 15 to 18 . . . interface (I/F), 20 . . . charged particle beam device main body, 30 . . . monitor, 40 . . . remote control terminal, 101 . . . device control software, 103 . . . resource monitoring unit, 104 . . . allocation availability determination unit, 105 . . . operating system (OS), 106 . . . notification unit, 301 . . . remote control software, 401 . . . process list, 402 . . . process stop button, 403 . . . end button, 501 . . . camera unit, 601 . . . resource amount restriction setting screen, 602 . . . display unit, 603 . . . input unit, 701 . . . display area setting screen, 702 . . . first display section, 703 . . . second display section, T1 to T6 . . . terminal.

The invention claimed is:

1. A charged particle beam device, comprising:
a charged particle beam device main body;
a computer configured to control the charged particle beam device main body, including at least a CPU and a DRAM, and including software for controlling the charged particle beam device main body;
a monitoring unit configured to monitor a resource usage status in the computer;
an allocation availability determination unit configured to determine whether or not a resource for executing processing required by the software is allocatable in the computer according to a monitoring result of the monitoring unit;
a notification unit configured to notify, when the determination of the allocation availability determination unit is negative, information indicating that the determination is negative; and
a restriction unit configured to restrict, when the determination of the allocation availability determination unit is negative, a usage amount of the resource of the computer to be used by the software;

wherein the restriction unit is configured to, as the restriction, change a size of an observation image imaged and observed by the charged particle beam device main body and a capturing interval.

2. The charged particle beam device according to claim 1, wherein
when the determination of the allocation availability determination unit is positive, whether or not a restriction related to the usage amount of the resource of the computer to be used by the software is determined, and when the restriction is set, the software releases the restriction.

3. The charged particle beam device according to claim 2, wherein
the software is configured to allow a user to select whether to release the restriction before the restriction is released.

4. The charged particle beam device according to claim 1, wherein
the software is configured such that a usage rate of the CPU or a usage amount of the DRAM provided in the computer is restricted as the restriction.

5. The charged particle beam device according to claim 1, wherein
the restriction unit is configured to, as the restriction, stop a process executed by the software.

6. The charged particle beam device according to claim 1, wherein
the computer is configured to be connectable to an external computer via a network.

\* \* \* \* \*